United States Patent
Inoue

(10) Patent No.: US 7,049,862 B2
(45) Date of Patent: May 23, 2006

(54) SEMICONDUCTOR DEVICE

(75) Inventor: Takahiro Inoue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 30 days.

(21) Appl. No.: 10/851,314

(22) Filed: May 24, 2004

(65) Prior Publication Data

US 2005/0041444 A1 Feb. 24, 2005

(30) Foreign Application Priority Data

Aug. 18, 2003 (JP) .............................. 2003-294473

(51) Int. Cl.
*H03B 1/10* (2006.01)
(52) U.S. Cl. ....................................... 327/110; 327/374
(58) Field of Classification Search ................. 327/74, 327/77, 109, 110, 374, 376, 377, 427, 432, 327/433, 478

See application file for complete search history.

(56) References Cited

U.S. PATENT DOCUMENTS

| | | |
|---|---|---|
| 6,535,405 B1 * | 3/2003 | Chen ............................. 363/65 |
| 6,720,819 B1 * | 4/2004 | Yamamoto ..................... 327/427 |
| 6,774,682 B1 * | 8/2004 | Theobald et al. ............. 327/110 |

FOREIGN PATENT DOCUMENTS

| | | |
|---|---|---|
| JP | 5-276000 | 10/1993 |
| JP | 2002-300019 | 10/2002 |

* cited by examiner

*Primary Examiner*—Jeffrey Zweizig
(74) *Attorney, Agent, or Firm*—Oblon, Spivak, McClelland, Maier & Neustadt, P.C.

(57) ABSTRACT

A semiconductor device includes a power device, and a driver which drives the power device. The driver includes a capacitor which is charged or discharged in correspondence to an external control signal, a first comparator which compares a voltage of the capacitor with a first reference voltage, and outputs a first signal based on a result of the comparison, a drive controller which outputs a drive signal in correspondence to the first signal to the power device; and a capacitor charger which detects the voltage of the capacitor, and supplies a current to the capacitor to charge the capacitor when the voltage of the capacitor is increasing within a given range.

7 Claims, 9 Drawing Sheets

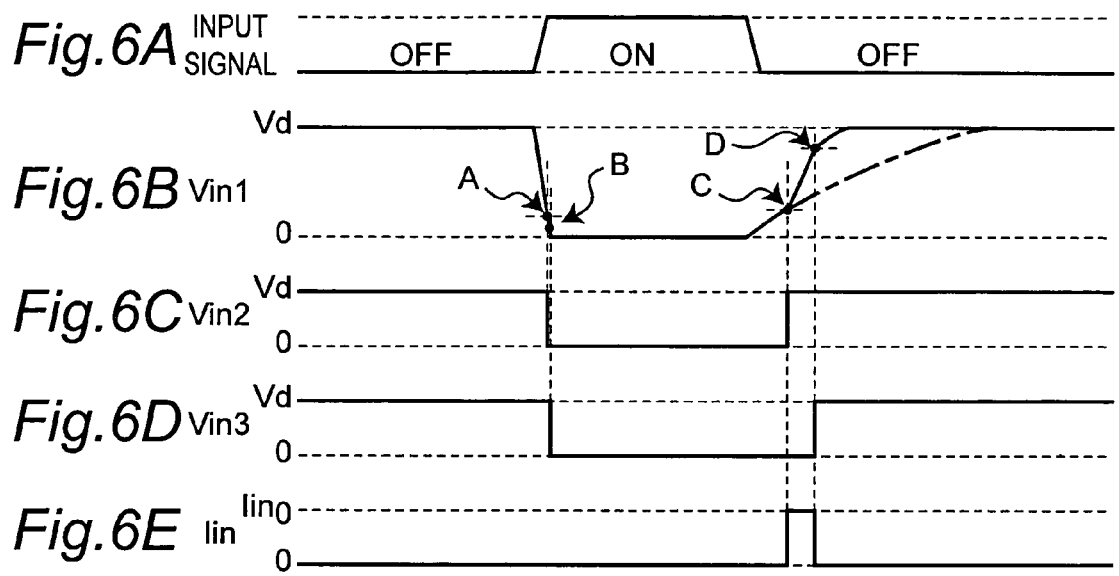
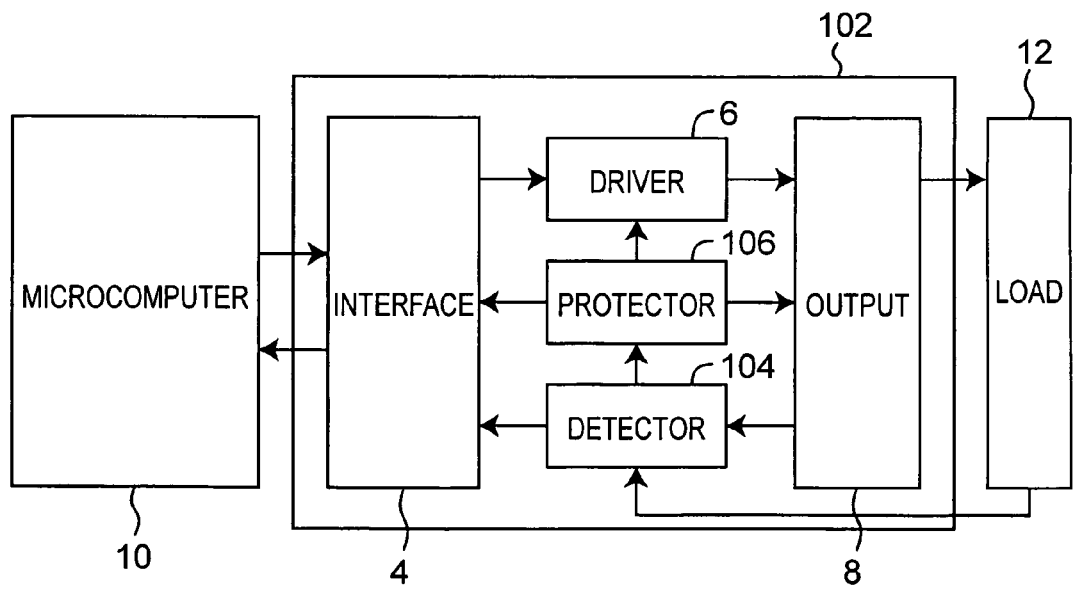

SEMICONDUCTOR DEVICE

BACKGROUND OF THE INVENTION

1. Field of the Invention

The present invention relates to a semiconductor device and more particularly a semiconductor device including a power device and a driver which drives the power device.

2. Description of the Related Art

Power devices are used in a power electronics based apparatus such as a universal inverter and an uninterruptible power supply (UPS). Insulated gate bipolar transistors (hereinafter, referred to as "IGBT") are becoming mainstream as the power devices. Further, an intelligent power module (hereinafter, referred to as "IPM") in which an IGBT, its driver, and its protector are integrated into one module has been recently put to practical use. The driver in the IPM is required to perform the ON-OFF control swiftly and securely.

A driver for the IGBT in a general IPM will be described in the following. The driver switches on and off the IGBT by controlling the gate voltage of the IGBT. The driver controls the gate voltage in correspondence to a control signal input to the driver from a controller outside of the IPM. The transmission of the control signal from the controller to the driver is usually done by using a photo-coupler, so that the driver is connected to the photo-coupler at its input side. The detail of the input-side configuration of the driver will be described in the following. The driver includes a capacitor, a comparator, and a drive controller. One end of the capacitor is connected to one input terminal (a first input terminal) of the comparator, and the other end thereof is grounded. An output terminal of the comparator is connected to an input terminal of the drive controller. An output terminal of the drive controller is connected to a gate terminal of the IGBT.

The capacitor, which eliminates outside noise, is connected to the photo-coupler. The terminal of the capacitor, which is connected to the first input terminal of the comparator, is also connected to a collector terminal of a phototransistor of the photo-coupler. An emitter terminal of the phototransistor is grounded, and a collector terminal of the phototransistor is connected to a power supply through a resistor. In this configuration, when the control signal is input to the primary side of the photo-coupler from the controller, the control signal is transmitted to the secondary side (corresponding to the phototransistor) of the photo-coupler, so that the phototransistor switches on or off. When the phototransistor switches off, current flows into the capacitor from the power supply through the resistor, that is, the capacitor is charged. While, when the phototransistor switches on, current flows into the phototransistor from the power supply through the resistor. Here, if the capacitor has been charged, current flows from the capacitor, and the capacitor is discharged. In this way, the capacitor is charged or discharged in correspondence to the control signal from the controller, so that the voltage applied to the first input terminal of the comparator is varied.

The comparator compares the value of the voltage input to the first input terminal thereof with that of the voltage (a fixed reference voltage) input to the other terminal thereof (referred to as "a second input terminal"), and outputs a voltage signal into the drive controller based on the comparison results. Specifically, the comparator outputs a high-level (H) signal, if the voltage input to the first input terminal thereof is higher than the fixed reference voltage, and outputs a low-level (L) signal, if the voltage input to the first input terminal thereof is equal to or lower than that. The drive controller outputs a voltage signal, which is in correspondence to the output voltage of the comparator, into the IGBT. The IGBT switches on and off in correspondence to the output signal of the drive controller. Generally, the IGBT switches off when the output signal of the comparator is at high level, and the IGBT switches on when the output signal of the comparator is at low level.

In the above circuit, the resistance of the resistor connected to the collector terminal of the phototransistor is set relatively high in order to limit the current flowing into the photo-coupler within the current capacity. Here, the charging time for the capacitor is represented by the product of the resistance R and the capacitance C, i.e. the time constant CR. Therefore, if the resistance is large, i.e. the impedance is high, then the capacitor is charged slowly. When the capacitor is charged, the IGBT is turned off. If the capacitor is charged slowly, the rise speed of the voltage at a signal line (referred to as "a voltage-input signal line"), connected to the first input terminal of the comparator, becomes low. That is, the voltage at the voltage-input signal line stays near the threshold value, by which the IGBT is switched off, for a time before and after the voltage at the voltage-input signal line exceeds the threshold value. If, at this time, a large amount of dV/dt (this indicates the rate of change of the voltage between the collector and emitter terminals of the IGBT, i.e. so-called spike voltage) occurs, the voltage at the voltage-input signal line can fluctuate by, for example, the electromagnetic induction between wiring lines. If the fluctuation of the voltage occurs, it causes serious malfunction of the driver and the IGBT, because the fluctuation occurs near the threshold value.

In order to prevent the above-mentioned malfunction due to a large amount of dV/dt, one of conventional drivers includes a drive circuit which drives a gate of a power device, a protection circuit which protects the power device, a control circuit which outputs a signal that switches the power device on and off to the drive circuit in correspondence to a signal from the outside and a signal from the protector, and a regulator circuit which generates a voltage lower than the voltage of the external control power supply to provide it to the protection circuit and the control circuit (For example, refer to the Japanese Patent laid-open No. 5-276000). According to this driver, even if the voltage of the control power supply fluctuates by dV/dt in switching of the power device, the fluctuation is absorbed in the regulator circuit, so that the malfunctions of the control circuit and the protection circuit can be prevented.

There has also been a configuration in which, a pull-up circuit consisted of a depression-type metal-oxide semiconductor (hereinafter, referred to "MOS") with its gate and source terminals connected to each other and a p-channel MOS, a pull-down circuit consisted of a depression-type MOS with its gate and source terminals connected to each other and an n-channel MOS, a Zener diode, and a capacitor are arranged between a resistor and a photo-coupler, and driver (For example, refer to Laid-Open Japanese Patent Publication 2002-300019.). In this configuration, when the photo-coupler is off, the voltage of the capacitor connected to the photo-coupler is at high level (pull-up), so that a large current flows into the driver through the pull-up circuit. While, when the photo-coupler is on, the voltage of the capacitor is at low level (pull-down), so that a current flows through the pull-down circuit. According to this configuration, when the photo-coupler is off, the malfunction due to noise can be prevented because a large current flows into the driver. Further, when the photo-coupler is on, power consumption can be reduced because the current bypassing to the phototransistor is small.

Further, there has been a configuration in which two drive means having different power supplies are connected to a gate terminal of a power device, and the drive speed of the power device is varied by switching between the two driver means (For example, Laid-Open Japanese Patent Publication No. 10-23743.) According to this configuration, during a first period when a surge voltage may not occur, the power device is driven at high speed so that the switching loss can be reduced, and during a second period when a surge voltage may occur, the power device is driven at low speed so that the surge voltage can be restrained.

The drivers disclosed in such as the Laid-Open Japanese Patent Publication No. 10-23743 are aimed at reducing a switching loss during switching of the power device and restraining a surge voltage. In such publications, the malfunction due to above-described dV/dt isn't mentioned at all.

The drivers disclosed in Laid-Open Japanese Patent Publications No. 5-276000 and No. 2002-300019 have configurations to prevent the malfunction due to dV/dt occurred in switching the power device. However, a driver in which the malfunction can be prevented more precisely, i.e. accurately at the time of necessity, is desired.

SUMMARY OF THE INVENTION

An object of the present invention is to provide a semiconductor device which includes a power device and a driver which drives the power device, and in which the malfunction of the driver can be precisely prevented in switching the power device.

According to one aspect of the present invention, a semiconductor device includes a power device, and a driver which drives the power device. The driver includes a capacitor which is charged or discharged in correspondence to an external control signal, a first comparator which compares a voltage of the capacitor with a first reference voltage, and outputs a first signal based on a result of the comparison, a drive controller which outputs a drive signal in correspondence to the first signal to the power device; and a capacitor charger which detects the voltage of the capacitor, and supplies a current to the capacitor to charge the capacitor when the voltage of the capacitor is increasing within a given range.

An advantage of the semiconductor device of the present invention is that the malfunction of the driver is precisely prevented.

BRIEF DESCRIPTION OF THE DRAWINGS

The following is a detailed description of main embodiments of the invention, with reference to the drawings in which the same numerical references designate the corresponding elements throughout the different drawings.

FIG. 6A is a waveform chart of a signal input to the photo-coupler from a controller, FIG. 6B is a waveform chart of a voltage Vin1 of the capacitor in the driver as shown in FIG. 4a, FIG. 6C is a waveform chart of an output voltage Vin2 of a comparator in the driver as shown in FIG. 4a, FIG. 6D is a waveform chart of an output voltage Vin3 of the comparator in the driver as shown in FIG. 4a, and FIG. 6E is a waveform chart of the current flowing through a switch in the driver as shown in FIG. 4a.

FIG. 7 is a block diagram of a semiconductor device which includes a detector and a protector.

DESCRIPTION OF THE PREFERRED EMBODIMENTS

The following is a detailed description of the main embodiments of the invention, with reference to the drawings in which the same numerical references identify the same elements in each of the different drawings.

First Embodiment

Figure 1:
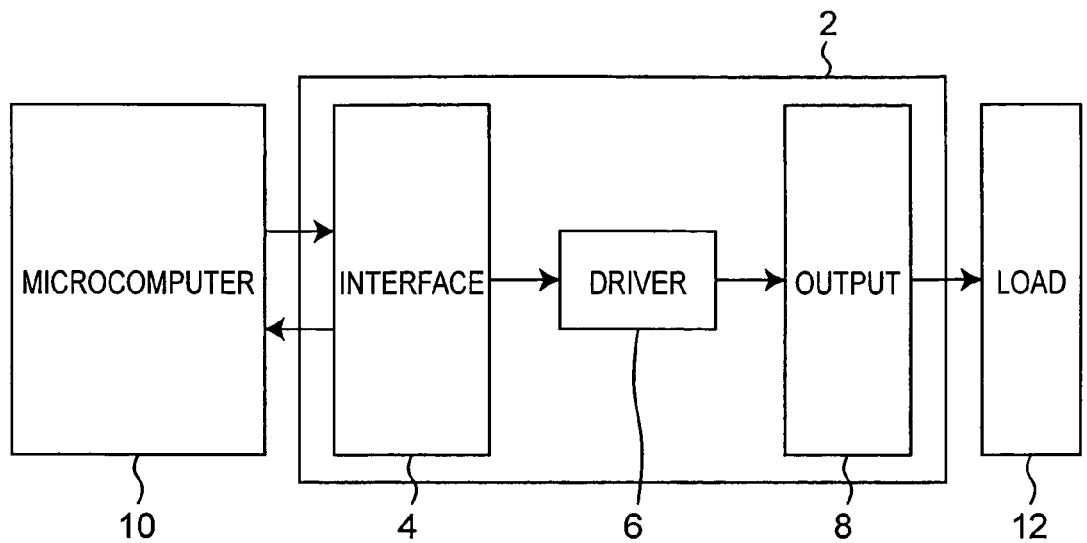
FIG. 1 is a block diagram of a semiconductor device according to a first embodiment of the present invention.

FIG. 1 is a block diagram of a semiconductor device (a power module) according to a first embodiment of the present invention. As shown in FIG. 1, the semiconductor device 2 has an interface 4, a driver 6, and an output circuit consisted of power devices 8. This semiconductor device 2 is connected at its input side to a microcomputer 10 and at its output side to a load 12. The interface 4 communicates with the microcomputer 10 and transmits an instruction from the microcomputer 10 to the driver 6. The driver 6 drives the output circuit 8 according to the instruction from the microcomputer 10. The output circuit 8 operates based on the drive signal from the driver 6, and outputs a signal to the load 12.

Figure 2:
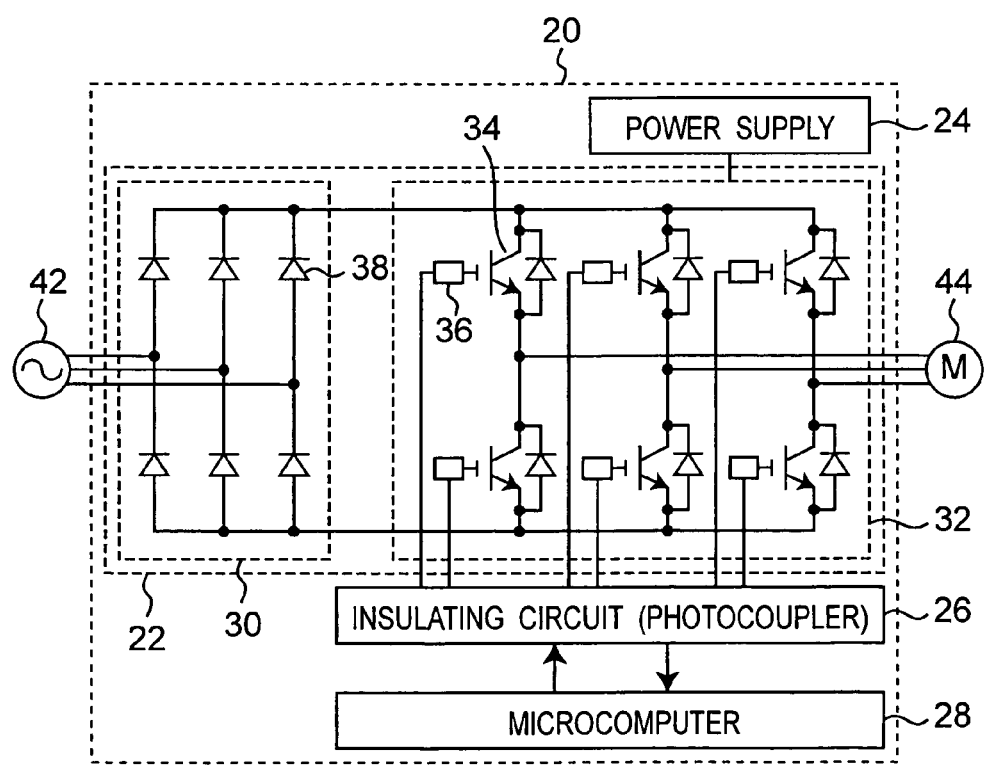
FIG. 2 is a block diagram of an inverter with the semiconductor device shown in FIG. 1.

The configuration and operation of the semiconductor device 2 will be described in detail in the following. An inverter to which the semiconductor device 2 is applied will be described in the following, although it can be applied to various power electronics based devices. FIG. 2 is a block diagram of an (three-phase) inverter to which the semiconductor device as shown in FIG. 1 is applied. As shown in FIG. 2, an inverter 20 has a main circuit 22, a power supply 24, an insulating circuit (photo-coupler) 26, and a microcomputer 28. The main circuit 22 has a converter section 30 and an inverter section 32. The semiconductor device 2 is used in this inverter section 32. The inverter section 32 includes six power devices 34 and six drivers 36, each of which drives a corresponding power device 34. The six power devices 34 correspond to the output circuit 8 in the semiconductor device 2 shown in FIG. 1, and the six drivers 36 correspond to the driver 6 in the semiconductor device 2. The converter section 30 is a rectifier circuit consisted of a diode bridge 38.

The power supply 24 is connected to the inverter section 32, and is exclusively used for the inverter section 32. The insulating circuit 26 is connected between driver 36 in the inverter section 32 and the microcomputer 28, and mainly transmits a signal from the microcomputer 28 to the driver 36. The inverter 20 is connected at its input side to an AC power supply 42 and is connected at its output side to a load (motor) 44. The inverter 20 rectifies an AC voltage from the AC power supply 42 by the rectifier circuit 30, and converts the obtained DC voltage into a three-phase AC voltage again at the inverter section 32 to supply power to the motor 44. The motor 44 corresponds to the load 12 shown in FIG. 1.

Figure 3:
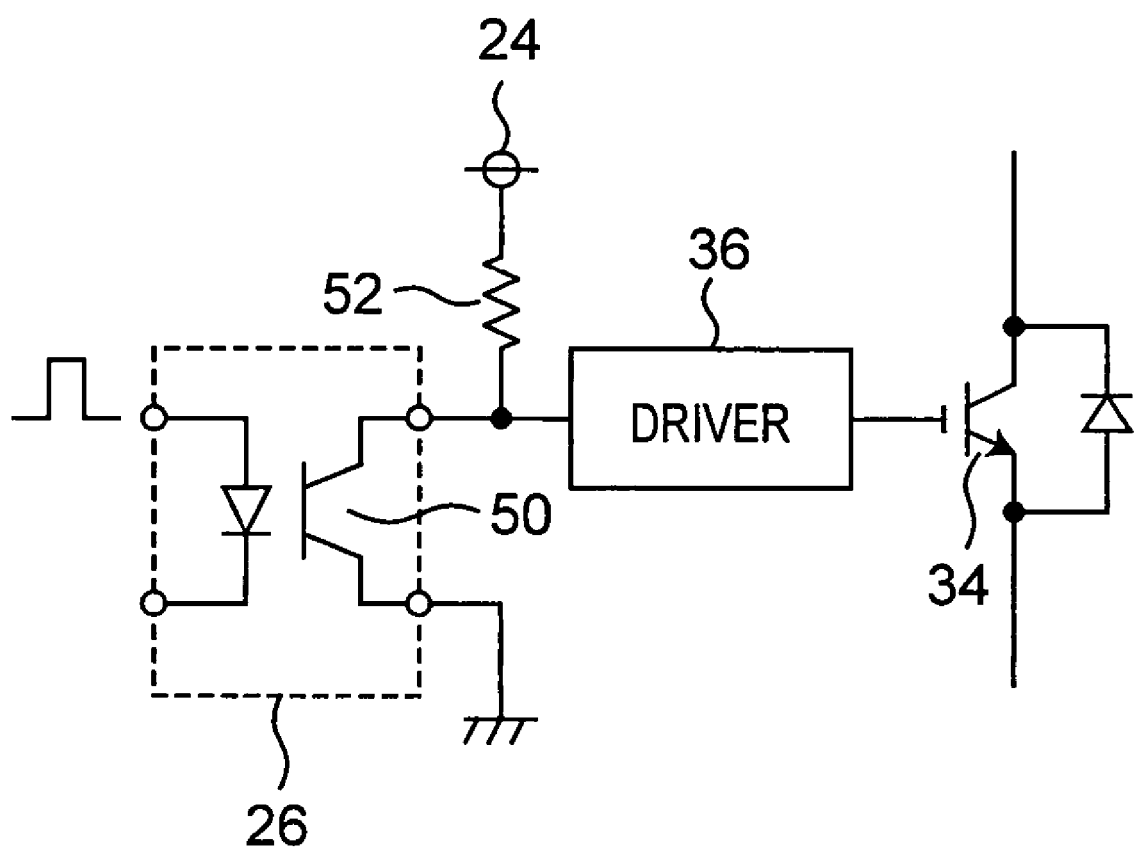
FIG. 3 is a diagram of one power transistor and its driver extracted from an inverter portion shown in FIG. 2.

FIG. 3 is a diagram of the power device 34 and its driver 36 in the inverter section 32 as shown in FIG. 2. As shown in FIG. 3, the driver 36 is connected to the photo-coupler 26. The driver 36 receives a control signal from the controller (microcomputer) 40 through the photo-coupler 26. The emitter terminal of a phototransistor 50 in the photo-coupler 26 is grounded, and the collector terminal thereof is connected to the power supply 24 through a resistor 52. The phototransistor 50 switches on and off in correspondence to the control signal output from the controller 40. When the phototransistor 50 switches on, current flows into the phototransistor 50 from the power supply 24 through the resistor 52. While, when the phototransistor 50 switches off, current flows into the driver 36 from the power supply 24 through the resistor 52. That is, the signal input to the driver 36 changes in correspondence to the control signal output from controller 40. The output signal of the driver 36 is varied in correspondence to the input signal thereof. The output signal of the driver 35 is transmitted to the power device 34.

Figure 4A:
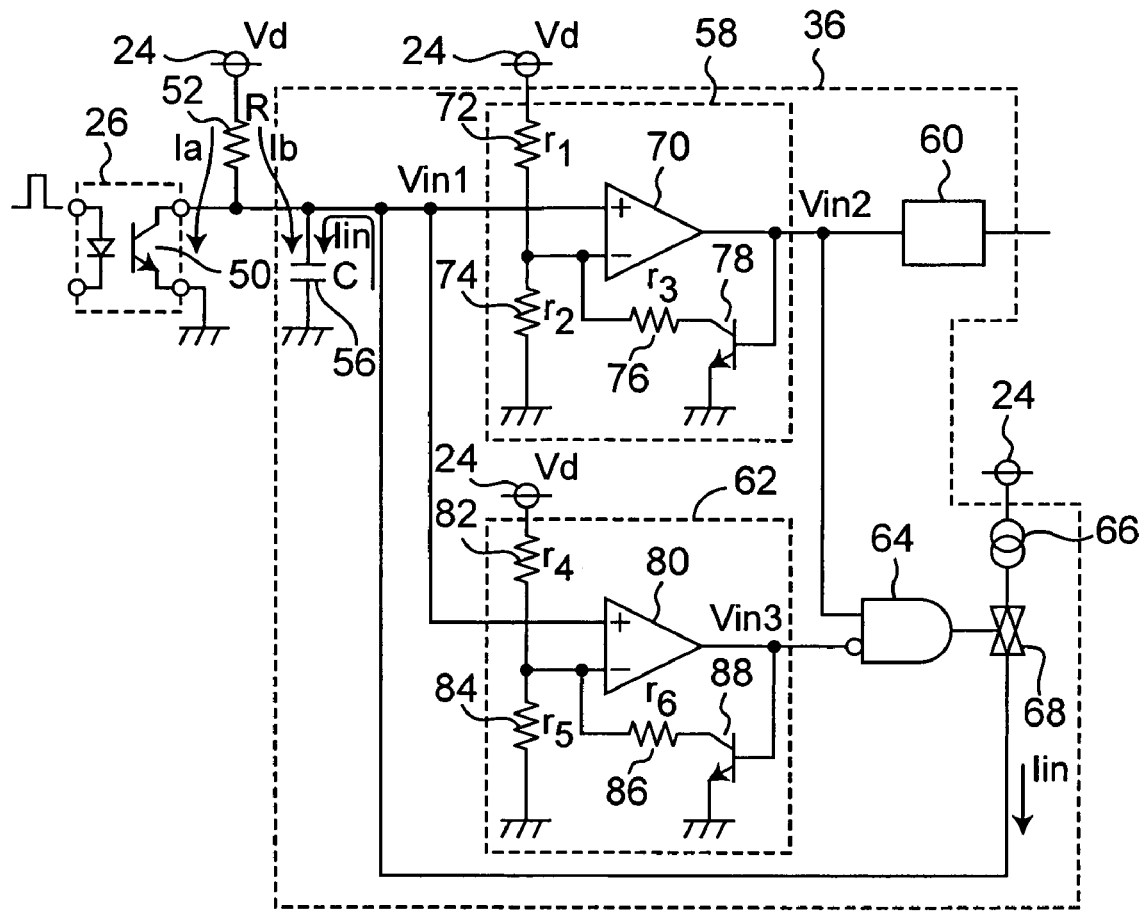
FIG. 4A is a circuit diagram of the driver of the semiconductor device according to the first embodiment.
Figure 4B:
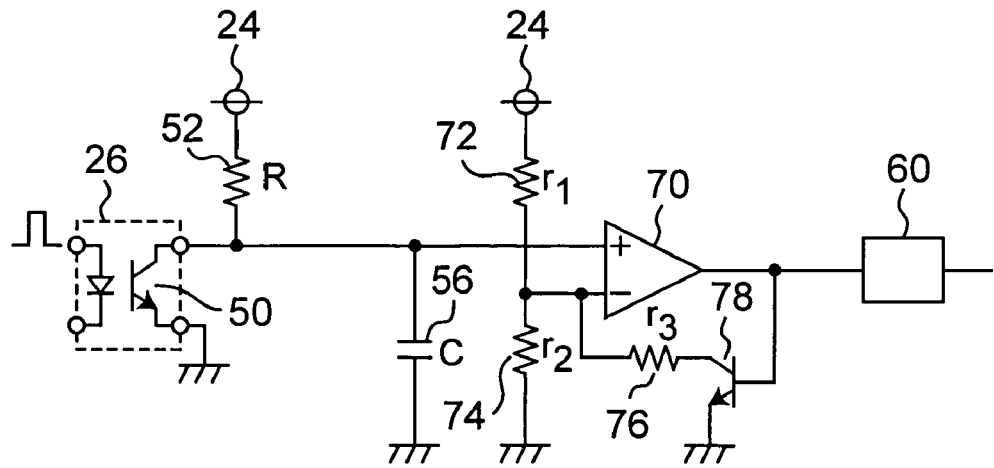
FIG. 4B is a circuit diagram of the driver of a conventional semiconductor device.

The driver 36 will be described in detail in the following. FIG. 4A is a circuit diagram of the driver in a semiconductor device according to this embodiment, and FIG. 4B is a circuit diagram of a driver in a conventional semiconductor device for comparison. The driver in the semiconductor device of this embodiment will now be described with reference to FIG. 4A. The power device 34 driven by the driver 36 is a voltage-driven type device (for example, IGBT). As shown in FIG. 4A, the driver 36 includes a capacitor 56, a first comparison section 58, a driver control section 60, a second comparison section 62, an AND circuit 64, a current source 66, and a switch 68. The driver as shown in FIG. 4A has a configuration in which the second comparison section, the AND circuit, the current source, and the switch are added to the driver as shown in FIG. 4B.

The capacitor 56 is connected to the phototransistor 50 in parallel. That is, one end of the capacitor 56 is grounded, and the other end thereof is connected to the collector terminal of the phototransistor 50. As a result, the end of the capacitor 56 is connected to the power supply 24 through the resistor 52.

The first comparison section 58 has a comparator 70 consisted of an operational amplifier, resistors 72, 74, 76, and a transistor 78. A first input terminal of the comparator 70 is connected to the capacitor 56, and a second input terminal thereof is connected to the voltage dividing resistors 72 and 74 that divide the voltage of the power supply 24. The resistors 72 and 74 are connected to each other in series. One end of the resistor 72 is connected to the power supply 24, and one end of the resistor 74 is grounded. The resistor 76 and the transistor 78 are connected between the second input terminal of the comparator 70 and the output terminal of the comparator 70. One end of the resistor 76 is connected to the second input terminal of the comparator 70, and the other end thereof is connected to a collector terminal of the transistor 78. An emitter terminal of the transistor 78 is grounded, and a gate terminal thereof is connected to an output terminal of the comparator 70. The output terminal of the comparator 70 is connected to an input terminal of the driver control section 60.

An output terminal of the driver control section 60 is connected to a control terminal of the power device 34. The driver control section 60 outputs a voltage signal, which is in correspondence to a signal input thereto from the comparator 70, to the control terminal of the power device 34. The driver control section 60 includes a circuit that inverts the output signal of the comparator 70. The driver control section 60 outputs a low-level signal that turns off the power device 34 when the output signal of the comparator 70 is at high level, and outputs a high-level signal that turns on the power device 34 when the output signal of the comparator 70 is at low level.

The second comparison section 62 includes a comparator 80 consisted of an operational amplifier, resistors 82, 84, 86, and a transistor 88. A first input terminal of the comparator 80 is connected to the capacitor 56, and a second input terminal thereof is connected to the voltage dividing resistors 82 and 84 that divide the voltage of the power supply 24. The resistors 82 and 84 are connected to each other in series. One end of the resistor 82 is connected to the power supply 24, and one end of the resistor 84 is grounded. The resistor 86 and the transistor 88 are connected between the second input terminal of the comparator 80 and an output terminal of comparator 80. One end of the resistor 86 is connected to the second input terminal of the comparator 80, and the other end thereof is connected to a collector terminal of the transistor 88. An emitter terminal of the transistor 88 is grounded, and a gate terminal thereof is connected to an output terminal of the comparator 80.

The first and second input terminals of the AND circuit 64 are connected to the output terminal of the comparator 70 and the output terminal of the comparator 80, respectively. An output terminal of the AND circuit 64 is connected to the switch 68. The AND circuit 64 inverts the level of the actual signal input to its second input terminal, and operates as if the inverted level of the signal is input to its second input terminal.

The switch 68 is a bi-directional analog switch. An output terminal of the AND circuit 64 is connected to a control terminal of the switch 68. The switch 68 turns on and off in correspondence to the signal input to its control terminal. When the switch 68 turns on, current Iin flows from the current source 66 through the switch 68.

Figure 5:
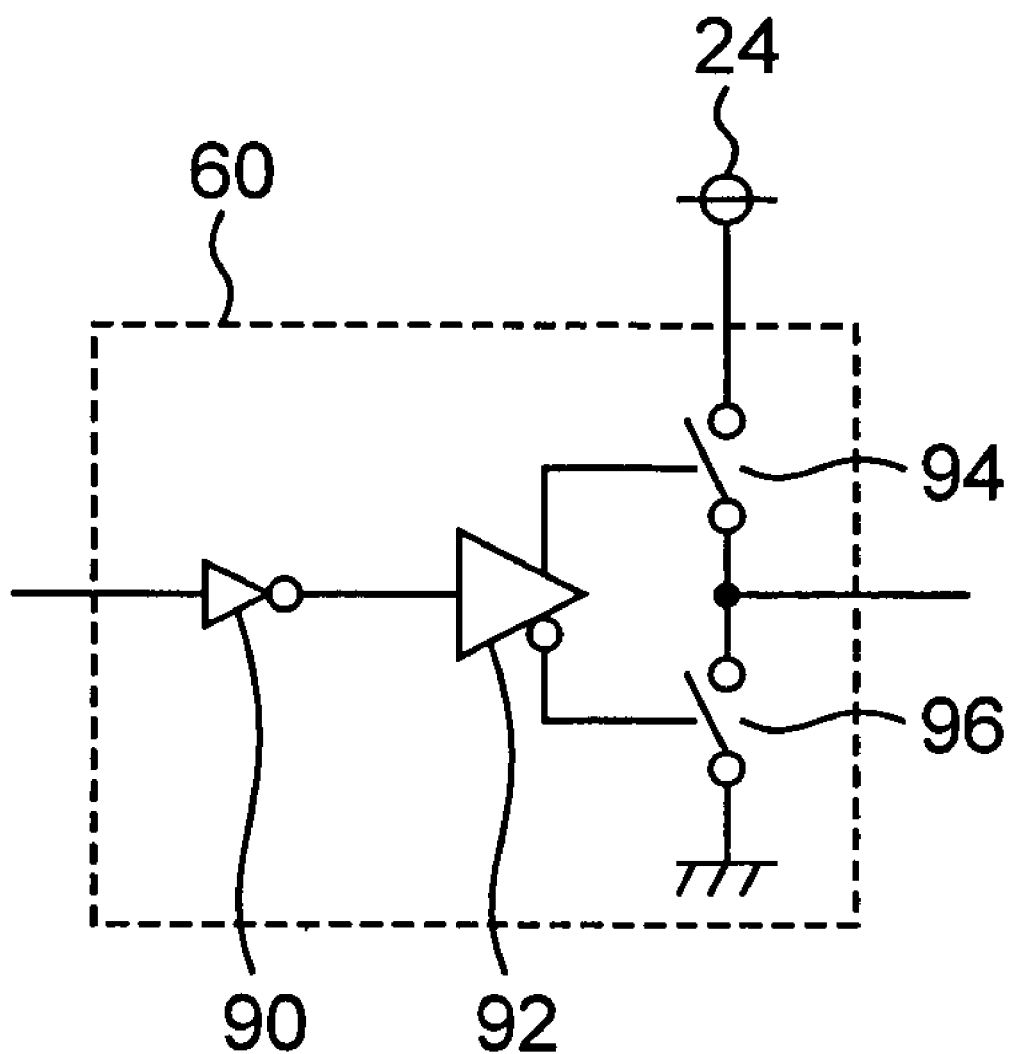
FIG. 5 is a circuit diagram of a drive control unit.

The configuration and operation of the driver control section 60 will now be described in more detail in the following. FIG. 5 is a circuit diagram of the driver control section 60. As shown in FIG. 5, the driver control section 60 includes an inverter 90, an operational amplifier 92, and two switches 94, 96. The output terminal of the comparator 70 is connected to an input terminal of the inverter 90. An output terminal of the inverter 90 is connected to an input terminal of the operational amplifier 92. The inverter 90 inverts the output signal of the comparator 70 and outputs the inverted signal to the operational amplifier 92. The operational amplifier 92 amplifies the output signal of the inverter 90 and outputs the amplified signal to the switches 94 and 96. At this time, the operational amplifier 92 outputs both an inverted signal of the amplified signal and a non-inverted signal thereof. The non-inverted signal output from the operational amplifier 92 is transmitted to the first switch 94, and the inverted signal output from it is transmitted to the second switch 96. Each of the first and second switches 94 and 96 turns on when a high-level signal is transmitted from the operational amplifier 92 to each of them. When the first switch 94 turns on, the control terminal of the power device 34 is connected to the power supply 24, and a high-level signal is input to it. While, when the second switch 96 turns on, the control terminal of the power device 34 is grounded, and a low-level signal is input to it. In this driver control section 60, when the output signal of the comparator 70 is at high level, the output signal of the inverter 90 becomes low level, so that the signals transmitted to the first and second switches 94 and 96 become low level and high level, respectively. Therefore, only the second switch 96 turns on, and the signal output to the power device 34 from the driver control section 60 becomes low level, so that the power device 34 turns off. While, when the output signal of the comparator 70 is at low level, the output signal of the inverter 90 becomes high level, so that the signals transmitted to the first and second switches 94 and 96 become high level and low level, respectively. Therefore, only the first switch 94 turns on, and the signal output from driver control section 60 to the power device 34 becomes high level, so that the power device 34 turns on.

Next, a reference voltage input to the comparator 70 in the first comparison section 58 and that input to the comparator 80 in the second comparison section 62 will be described. The voltage Vin1 of the capacitor 56 is input to the first input terminal of the comparator 70, and a constant voltage (that is, the reference voltage) is input to the second input terminal thereof. The comparator 70 compares the voltage Vin1 with the reference voltage, and outputs a voltage Vin2 based on the comparison results. Specifically, the comparator 70 outputs a high-level voltage when the voltage Vin1 exceeds the reference voltage; and outputs a low-level voltage when the voltage Vin1 does not exceed the reference voltage. The transistor 78 turns on when the output voltage of comparator 70 is at high level, and turns off when it is at low level. When the transistor 78 turns on, current flows from the power supply 24 through the resistors 72 and 76. While, when the transistor 78 turns off, current flows not through the resistors 72 and 76 but through the resistors 72 and 74. Therefore, the value Eref1 of the reference voltage, which is input to the second input terminal of the comparator 70, varies depending on whether the voltage Vin2 is high-level or low-level. Let the value of the power supply voltage Vd, and let the resistances of the resistors 72, 74, 76 be r1, r2, r3, respectively. Then the value $Eref1_H$ of the reference voltage when the voltage Vin2 is at high-level, is given by the Eqs. (1).

$$Eref1_H = Vd \cdot \frac{r2 // r3}{r1 + (r2 // r3)}, \quad (1)$$

where $$r2 // r3 = \frac{r2 \cdot r3}{r2 + r3}.$$

Also, the value $Eref1_L$ of the reference voltage when the voltage Vin2 is at low-level, is given by Eqs. (2).

$$Eref1_L = Vd \cdot \frac{r2}{r1 + r2}. \quad (2)$$

While, the voltage Vin1 of the capacitor 56 is input to the first input terminal of the comparator 80 in the second comparison section 62, and a constant voltage (that is a reference voltage) is input to the second input terminal thereof. The comparator 80 compares the voltage Vin1 with the reference voltage, and outputs a voltage Vin3 to the AND circuit 64 based on the comparison results. Specifically, the comparator 80 outputs a high-level voltage when the voltage Vin1 exceeds the reference voltage, while it outputs a low-level voltage when the voltage Vin1 does not exceed the reference voltage. The transistor 88 turns on when the output voltage of the comparator 80 is at high level, while it turns off when the output voltage of the comparator 80 is at low level. When the transistor 88 turns on, current flows from the power supply 24 through the resistors 82 and 86. While, when the transistor 88 turns off, current flows not through the resistors 82 and 86 but through the resistors 82 and 84. Therefore, the value Eref2 of the reference voltage, which is input to the second input terminal of comparator 80, varies depending on whether the voltage Vin3 is at high-level or at low-level. Let the value of the power supply voltage Vd, and let the resistances of resistors 82, 84, 86 be r4, r5, r6, respectively. Then the value $Eref2_H$ of the reference voltage when the voltage Vin3 is at high-level, and the value $Eref2_L$ thereof when the voltage Vin3 is at low-level, are given by Eqs. (3) and (4), respectively.

$$Eref2_H = Vd \cdot \frac{r5 // r6}{r4 + (r5 // r6)}, \quad (3)$$

where $$r5 // r6 = \frac{r5 \cdot r6}{r5 + r6},$$

and $$Eref2_L = Vd \cdot \frac{r5}{r4 + r5}. \quad (4)$$

The operation of the driver 36 will be described in the following. FIGS. 6A–6E are waveforms to explain the operation of the driver 36. FIG. 6A is a waveform of the signal input to the photo-coupler 26 from controller 40. FIG. 6B is the waveform of the voltage Vin1 of the capacitor 56. FIG. 6C is the waveform of the output voltage Vin2 of the comparator 70. FIG. 6D is the waveform of the output voltage Vin3 of the comparator 80. FIG. 6E is the waveform of the current Iin flowing through the switch 68. In the following, the operation of the driver 36 will be described separately when the power device 34 turns on (from off to on) and when the power device 34 turns off (from on to off). The power device 34 is off when the voltage Vin2 is at high level, and it is on when the voltage Vin2 is at low level. Initially, the power device 34 is off, and the voltages Vin1, Vin2, Vin3 are all at high level (each value of the voltages is Vd (V)).

A. When the Power Device Turns on:

When an ON-instruction signal (a high-level signal) is input from the controller 40 to the photo-coupler 26, the phototransistor 50 at the secondary side of the photo-coupler 26 turns on. When the phototransistor 50 turns on, current Ia flows in the phototransistor 50 from the power supply 24 through the resistor 52. Here, if the power supply voltage is Vd, and the resistance of the resistor 52 is R, then the value of Ia is Vd/R. Further, when the current flows in the phototransistor 50, current flows from the capacitor 56 to the phototransistor 50, so that the capacitor 56 is discharged (the capacitor 56 has charged, because the power device 34 is initially off.). As a result, the voltage Vin1 of the capacitor 56 declines (refer to FIG. 6B)

The comparator 70 compares the voltage Vin1 with the reference voltage. Initially, the power device 34 is off, and the voltage Vin2 is at high level, so that the value of the reference voltage is $Eref1_H$ (refer to Eqs. (1)). When the voltage Vin1 input to the comparator 70 declines, as described above, and its value becomes not higher than $Eref1_H$ (shown as point A in FIG. 6B), the comparator 70 outputs a low-level voltage Vin2 (0 V) (refer to FIG. 6C). The voltage Vin2 is output to the driver control section 60 and the AND circuit 64. $Eref1_H$ is referred to as an ON-threshold value as a threshold value that makes the voltage Vin2 low level to turn on the power device 34.

The driver control section 60 outputs a high-level signal to the power device 34 when it receives a low-level voltage signal (Vin2) from the comparator 70. The power device 34 starts to turn on by receiving this high-level signal.

While, the comparator 80 compares the voltage Vin1 with the reference voltage. In this case, the value of the reference voltage is $Eref2_H$ (refer to Eqs. (3)). When the value of the voltage Vin1 becomes equal to or lower than $Eref2_H$ (shown as point B in FIG. 6B), the comparator 80 outputs a low-level voltage Vin3 (0 V) (refer to FIG. 6D). The voltage Vin3 is output to the AND circuit 64.

The AND circuit 64 receives as its input signals the output voltage Vin2 of the comparator 70 and the output voltage Vin3 of the comparator 80. The AND circuit 64 treats the level of the signal input from the comparator 70 as the same as the level of the output voltage of the comparator 70, and treats the level of the signal input from the comparator 80 as the inverted level of the output voltage of the comparator 80. The AND circuit 64 outputs a high-level signal, if the two input signals are both at high level.

Here, Eqs. (5) is given for $Eref1_H$ and $Eref2_H$.

$$Eref2_H < Eref1_H \qquad (5)$$

Referring to Eqs. (5), the value $Vin1_0$ of the voltage Vin1 first reaches $Eref1_H$. When $Vin1_0$ becomes equal to or lower than $Eref1_H$, the voltage Vin2 becomes low level. When the relationship $Eref2_H < Vin1_0 \leq Eref1_H$ is hold, the voltage Vin2 is at low level, and the voltage Vin3 is at high level. In this case, the AND circuit 64 outputs a low-level signal, because it treats the level of the signal input from the comparator 80 as the inverted level of the output voltage of the comparator 80, and regards the two input signals as low-level signals. The AND circuit 64 outputs the low-level signal to the control terminal of the switch 68. When the switch 68 receives the low-level signal, it turns off and blocks the current Iin (its value $Iin_0$ is 0). After that, when the value of the voltage Vin1 becomes equal to or lower than $Eref2_H$, the voltage Vin3 becomes low level. The AND circuit 64 regards the voltage Vin3 as being at high-level. However, the output signal of the AND circuit 64 remains at low level, because the signal input from the comparator 70 is still low level. The voltage Vin1 declines to 0V ultimately. While, the reference voltage of the comparator 80 is set at $Eref2_L$, because the output signal of the comparator 80 becomes low level.

B. When the Power Device Turns Off:

When an OFF-instruction signal (low-level signal) is input from the controller 40 to the photo-coupler 26, the phototransistor 50 at the secondary side of the photo-coupler 26 turns off. When the phototransistor 50 turns off, current Ib flows into the capacitor 56 from the power supply 24 through the resistor 52. Here, if the power supply voltage is Vd, and the resistance of resistor 52 is R, then the value of Ib is Vd/R. When the current flows in capacitor 56, the capacitor 56 is charged, so that the voltage Vin1 input to the capacitor 56 rises (refer to FIG. 6B).

The comparator 70 compares the voltage Vin1 with the reference voltage. Here, the value of the reference voltage is $Eref1_L$ (refer to Eqs. (2)). When the value of the voltage Vin1 of the comparator 70 exceeds $Eref1_L$ (shown as point C in FIG. 6B), the comparator 70 outputs a high-level voltage Vin2 (refer to FIG. 6C). $Eref1_L$ is referred to as an OFF-threshold value as s threshold value that makes the voltage Vin2 high level to turns off the power device 34.

When the driver control section 60 receives a high-level voltage signal (Vin2) from the comparator 70, it outputs a low-level signal to the power device 34. The power device 34 starts to turn off by receiving this low-level signal.

While, the comparator 80 compares the voltage Vin1 with the reference voltage. In this case, the value of the reference voltage is $Eref2_L$ (refer to Eqs. (4)). When the value of the voltage Vin1 input to the comparator 80 exceeds $Eref2_L$ (shown as point D in FIG. 6B), the comparator 80 outputs a high-level voltage Vin3 (refer to FIG. 6D).

The AND circuit 64 receives as its input signals the output voltage Vin2 of the comparator 70 and the output voltage Vin3 of the comparator 80. Here, Eqs. (6) is given for the reference voltages $Eref1_L$ and $Eref2_L$.

$$Eref1_L < Eref2_L = \tfrac{2}{3} Vd. \qquad (6)$$

Referring to Eqs. (6), the value $Vin1_0$ of the voltage Vin1 first reaches $Eref1_L$. When the relation ship $Eref1_L < Vin1_0 \leq Eref2_L$ is hold, the voltage Vin2 is at high level, and the voltage Vin3 is at low level. In this case, the AND circuit 64 outputs a high-level signal, because the AND circuit 64 treats the level of the signal input from the comparator 80 as the inverted level of the output voltage of the comparator 80, and regards the two input signals as high-level signals. The AND circuit 64 outputs the high-level signal to the control terminal of the switch 68. When the switch receives the high-level signal, it turns on, and current Iin (its value is $Iin_0$ (A)) flows through the switch 68. The current Iin returns to the voltage-input signal line (that is, the signal line connected to the first input terminal of the comparator 70) and then flows into the capacitor 56 (refer to FIG. 6E). Therefore, the capacitor 56 is charged, and the value of the voltage Vin1 rises (refer to FIG. 6B).

Next, when the value of the voltage Vin1 exceeds $Eref2_L$ ($Eref2L < Vin1_0$), the voltage Vin3 becomes high level. As described above, the AND circuit 64 regards the voltage Vin3 as being at low-level. The AND circuit 64 outputs a low-level signal to the control terminal of the switch 68, because one of the two input signals is at low level. Therefore, the switch 68 turns off and blocks the current from the current source 66 (refer to FIG. 6E). The value of the voltage Vin1 becomes Vd (V) ultimately.

After that, when an ON-instruction signal or an OFF-instruction signal is input to the photo-coupler 26 again from the controller 40, the driver 36 performs the same operations described above in each case.

When the driver 36 receives an OFF-instruction signal from the controller 40, it allows the current Iin to flow in the voltage-input signal line, as long as the relationship $Eref1_L < Vin1_0 \leq Eref2_L$ is hold. By this process, the capacitor 56 is charged, and the voltage Vin1 rises. FIG. 6B shows the change of the voltage Vin1 in this case. Comparing this change with the change of the voltage Vin1 in a prior driver shown by a broken line (refer to FIG. 4B), it is found that the value of the voltage Vin1 rises to Vd more quickly after the value of voltage Vin1 exceeds the OFF-threshold value in the driver 36 according to this embodiment as shown in FIG. 4A than the prior driver as shown in FIG. 4B.

In the driver of the semiconductor device according to this embodiment, current Iin flows in the voltage-input signal line immediately after the voltage Vin1 at the voltage-input signal line exceeds the OFF-threshold value, and the impedance of the voltage-input signal line declines, so that the charging time of the capacitor becomes shorter. Thus, the voltage Vin1 rises immediately and sufficiently i.e. to a degree not to be influenced by dV/dt of the power device, after it exceeds the OFF-threshold value. Therefore, even if a large amount of dV/dt (so-called spike voltage) due to the turn-off of the power device occurs, the voltage at the voltage-input signal line does not fluctuate near the threshold value, so that the malfunction of the driver can be prevented. As a result, the malfunction of the power device can be prevented.

Further, according to the driver in the semiconductor device of this embodiment, the malfunction is precisely prevented because the voltage at the voltage-input signal line is always monitored, and if it is detected that the voltage at the voltage-input signal line is rising and within a predetermined range, then the voltage is adjusted. Further, according to the driver in the semiconductor device of this embodiment, no unnecessary current flows, so that the power consumption is reduced, because the current Iin flows only when the voltage at the voltage-input signal line is within a predetermined range.

Further, according to the driver in the semiconductor device of this embodiment, a driver, which does not malfunction by the switching operation of the power device, can be produced at relatively low cost.

$Eref2_L$ can be any value other than 2Vd/3, as long as it is higher than the OFF-threshold vale and lower than the value of the high-level of the voltage Vin1.

Further, the driver in the semiconductor device according to this embodiment may use the other logic circuits in place of the AND circuit in order to detect $Eref1_L < Vin1_0 \leq Eref2_L$.

The semiconductor device according to the present embodiment includes an interface, a driver, and output circuit consisted of the power devices, as shown in FIG. 1. However, it may further include other circuit such as a detector and a protector. FIG. 7 is a block diagram of a semiconductor device including such a detector and a protector. As shown in FIG. 7, the semiconductor device 102 includes an interface 4, a driver 6, a detector 104, a protector 106, and an output circuit 8. The semiconductor device 102 is connected at its input side to the microcomputer 10 and at its output side to the load 12. The detector 104 detects the drive states of the load 12 and the output circuit 8, for example, output current, temperature, and the like, and outputs the detection results to the protector 106 and the interface 4. The protector 106 determines the drive states of the load 12 and the output circuit 8 by using the detection results from the detector 104, and outputs a signal to the driver 6 and the output circuit 8 to make the operation of the output circuit 8 stop, if necessary.

Second Embodiment

Figure 8:
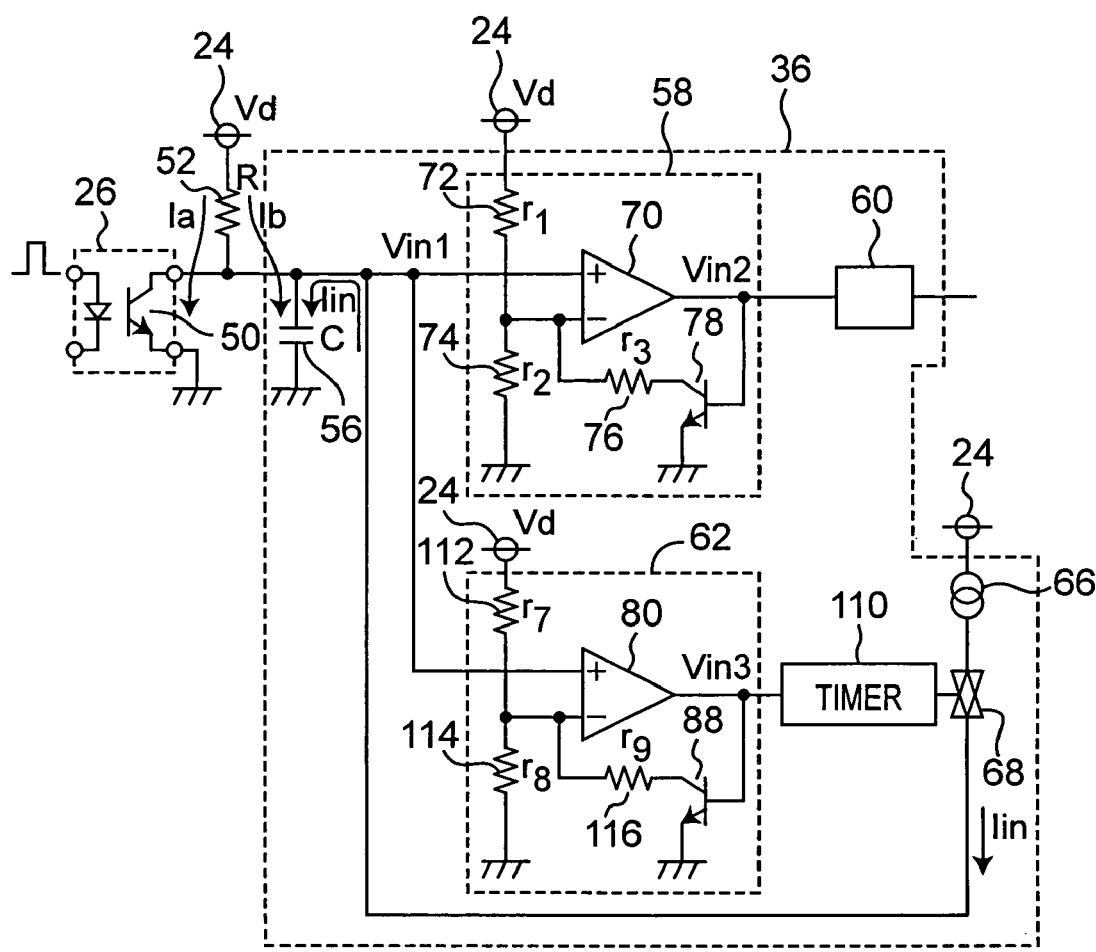
FIG. 8 is a circuit diagram of the driver of the semiconductor device according to the second embodiment.

FIG. 8 is a circuit diagram of the driver in a semiconductor device according to a second embodiment of the present invention. The driver in the semiconductor device according to this embodiment differs from that in the semiconductor device according to the first embodiment in that the AND circuit to which the voltages Vin2 and Vin3 are input is removed, a timer to which the voltage Vin3 is input is added. As shown in FIG. 8, the driver in the semiconductor device of this embodiment includes a timer 110 that is connected to the second comparator 62 and the switch 68. The second comparator 62 has resistors 112, 114, and 116. Let the resistances of the resistors 112, 114, 116 be r7, r8, r9, respectively. Then, in the same way as described in the first embodiment, the value $Eref3_H$ of the reference voltage when the output voltage of the comparator 80 is at high level is given by Eqs. (7), and the value $Eref3_L$ of the reference voltage when the output voltage of the comparator 80 is at low level is given by Eqs. (8).

$$Eref3_H = Vd \cdot \frac{r8 \,//\, r9}{r7 + (r8 \,//\, r9)}, \quad (7)$$

where $$r8 \,//\, r9 = \frac{r8 \cdot r9}{r8 + r9},$$

and $$Eref3_L = Vd \cdot \frac{r8}{r7 + r8}. \quad (8)$$

The timer 110 outputs a high-level signal to the switch 68 only for a predetermined period, and outputs a low-level signal to the switch 68 for the other time. Specifically, the timer 110 outputs the high-level signal to the switch 68 for a predetermined period from a time when the output signal of the comparator 80 in the second comparison section 62 turns from low level to high level, that is, the value of the voltage Vin1 exceeds $Eref3_L$. When the high-level signal is input to the switch 68, the switch 68 turns on, so that current Iin (the current value is $Iin_0$ (A)) flows therein. The current Iin returns to the voltage-input signal line, and then flows into the capacitor 56. Thus, the capacitor 56 is charged, and the value of the voltage Vin1 rises. The timer 110 outputs a low-level signal to the switch 68 after the predetermined period, and turns off the switch 68. By the above-mentioned process the current Iin flows in the capacitor 56 for a predetermined period after the voltage Vin1 exceeds $Eref3_L$.

Referring to Eqs. (8), $Eref3_L$ can be set at any value by properly selecting the values of the resistances r7 and r8. Therefore, if $Eref3_L$ is set at the same value as the OFF-threshold value, for example, then the current Iin starts to flow in the voltage-input signal line when the voltage Vin1 at the voltage-input signal line exceeds the OFF-threshold value. That is, by properly selecting the resistances r7 and r8, the condition on the voltage Vin1 at the time when the current Iin starts to flow in the voltage-input signal line can be set arbitrarily. $Eref3_L$ is equal to or higher than the OFF-threshold value and lower than the high-level voltage value Vd of the voltage Vin1. Preferably, $Eref3_L$ is near the OFF-threshold value. $Eref3_H$ can also be set at any value by properly selecting the resistances r7, r8, and r9.

In the driver in the semiconductor device according to this embodiment, the current Iin flows in the voltage-input signal line, and the impedance of the voltage-input signal line declines immediately when the voltage Vin1 at the voltage-input signal line exceeds $Eref3_L$. Thus, the charging speed of the capacitor is varied, and the rise speed of the voltage Vin1 becomes greater after it exceeds $Eref3_L$ than before it reaches $Eref3_L$. If $Eref3_L$ is set near the OFF-threshold value, the voltage Vin1 rises immediately and sufficiently i.e. to a degree not to be influenced by dV/dt of the power device, after it exceeds $Eref3_L$. In this case, even if a large amount of dV/dt due to the turn-on and turn-off of the power device occurs, the voltage at the voltage-input signal line does not fluctuate near the threshold value, so that the malfunction of the driver can be prevented. Further, as a result, the malfunction of the power device can be prevented.

Further, according to the driver in the semiconductor device of this embodiment, the malfunction is precisely prevented because the voltage at the voltage-input signal line is always monitored, and if it is detected that the voltage at the voltage-input signal line exceeds $Eref3_L$, then the voltage is adjusted.

Further, according to the driver in the semiconductor device of this embodiment, a driver, which does not malfunction by the switching operation of the power device, can be produced at relatively low cost.

Further, according to the driver in the semiconductor device of this embodiment, the excessive load current flowing in the photo-coupler can be restrained, because the charging time for the capacitor is limited to a predetermined period after the voltage Vin1 exceeds $Eref3_L$. Therefore, the lifetime of the photo-coupler can be extended, and the lifetime of the power electronics based apparatus with this semiconductor device can be extended.

The time period for which the current Iin flows i.e. the period for which the timer 110 outputs a high-level signal is within the time period from the time when the voltage Vin1 exceeds $Eref3_L$ to the time when it reaches the high-level voltage value Vd (that is a high level voltage). The time period can be optimized in relation to the charging speed of the capacitor. For example, when $Eref3_L$ is equal to the OFF-threshold value, the time period for which the current Iin flows may be several 10 s to 100 ns (100 nanoseconds).

In the driver in the semiconductor device according to this embodiment, the output signal of the second comparison section is fed into the timer. However, if $Eref3_L$ is set at the OFF-threshold value, the output signal of the first comparison signal can be fed into the timer. In this case, the second comparison section can be removed, so that the driver can be configured more simply.

Third Embodiment

Figure 9:
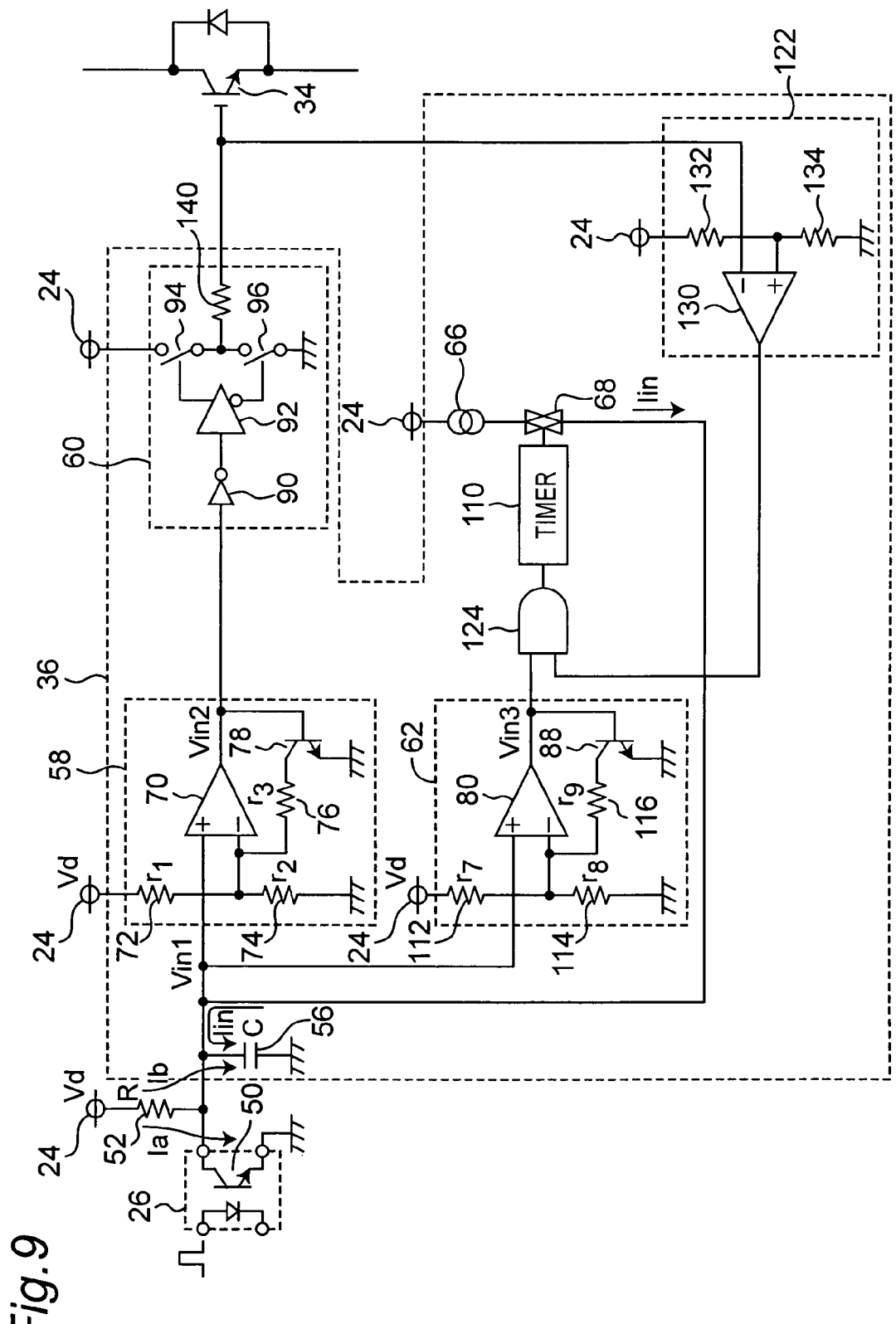
FIG. 9 is a circuit diagram of the driver of the semiconductor device according to the third embodiment.

FIG. 9 is a circuit diagram of a driver in a semiconductor device according to a third embodiment. The driver in the semiconductor device according to this embodiment differs from the driver in the semiconductor device according to the second embodiment in that it has a third comparison section 122, which compares the gate voltage of the power device 34 and a reference voltage, and an AND circuit 124, which receives the output signals of the second comparison section 62 and the third comparison section 122.

The third comparison section 122 includes a comparator 130 consisted of an operational amplifier, a resistor 132, and a resistor 134. A first input terminal of the comparator 130 is connected to the gate terminal of the power device 34, and the second input terminal thereof is connected to the resistors 132 and 134, which divide the power supply voltage. The resistors 132 and 134 are connected to each other in series. One end of the resistor 132 is connected to the power supply 24, and one end of the resistor 134 is grounded. The resistors 132 and 134 divide the power supply voltage, and provide the divided voltage to the second input terminal of the comparator 130.

The first and second input terminals of the AND circuit 124 are connected to the output terminal of the comparator 80 and the output terminal of the comparator 130, respectively. The output terminal of the AND circuit 124 is connected to the timer 110.

The operation of the driver 36 will be described in the following. In the third comparison section 122, the first input terminal of the comparator 130 receives the gate voltage of the power device 34, and the second input terminal of the comparator 130 receives a reference voltage. The comparator 130 compares the gate voltage with the reference voltage, and outputs a voltage signal based on the comparison results.

Specifically, if the gate voltage is lower than the reference voltage (the threshold voltage at which the power device starts to turn on), then the comparator 130 outputs a high-level voltage. The AND circuit 124 receives as its input signals the output voltage of the comparator 80 in the second comparison section 62 and the output voltage of the comparator 130. Here, the AND circuit 124 outputs a high-level signal, if the two input signals are both at high level, i.e. the value of the voltage at the voltage-input signal line exceeds $Eref3_L$, and the gate voltage of the power device 34 is lower than the threshold value at which the power device starts to turn on. The reference voltage input to the second input terminal of the comparator 130 can be lower than the threshold voltage at which the power device starts to turn on. In other words, the reference voltage can be the voltage at which the power device 34 becomes sufficiently off.

The operation of the timer 110 is the same as described in the second embodiment. That is, the timer 110 outputs a high-level signal to the switch 68 only for a predetermined period from a time when the output signal of the AND circuit 124 becomes high level, and outputs a low-level signal thereto for the other time. The operations of the driver 36 when a high-level signal is input to the switch 68 and when a low-level signal is input to the switch 68 are the same as described in the first embodiment.

In the driver 36, a difference may occur between the output voltage Vin2 of the comparator 70 and the voltage actually applied to the gate terminal of the power device 34, because the driver control section 60 is connected between the comparator 70 and the power device 34. For example, the driver control section 60 has a gate resistor 140 to restrain dV/dt. In the semiconductor device of this embodiment, the timer 110 starts to output a high-level signal to the driver, when the voltage Vin at the voltage-input signal line exceeds a reference voltage and the gate voltage of the power device 34 is lower than the reference voltage. Therefore, current can start to flow in capacitor 56 in precisely timing with the actual switching of the power device.

Further, according to the driver in the semiconductor device of this embodiment, the charging time for the capacitor is limited to a predetermined period, so that excessive load current flowing in the photo-coupler can be restrained. Therefore, the lifetime of the photo-coupler can be extended, and the lifetime of power electronics apparatus using this semiconductor device can be extended.

In the driver in the semiconductor device according to this embodiment, the current Iin flows in the voltage-input signal line, and the impedance of the voltage-input signal line declines immediately when the voltage Vin1 at the voltage-input signal line exceeds $Eref3_L$ and the power device starts to turn off. Thus, the rise speed of the voltage Vin1 becomes greater after the voltage Vin1 exceeds $Eref3_L$ and the power device starts to turn off than before that. If $Eref3_L$ is set near the OFF-threshold value, the voltage Vin1 rises immediately and sufficiently i.e. to a degree not to be influenced by dV/dt of the power device, after the voltage Vin1 exceeds $Eref3_L$ and the power device starts to turn off. In this case, even if a large amount of dV/dt due to the turn-on and turn-off of the power device occurs, the voltage at the voltage-input signal line does not fluctuate near the threshold value, so that the malfunction of the driver can be prevented. Further, as a result, the malfunction of the power device can be prevented.

Further, according to the driver in the semiconductor device of this embodiment, a driver, which does not malfunction by the switching operation of the power device, can be produced at relatively low cost.

Fourth Embodiment

Figure 10:
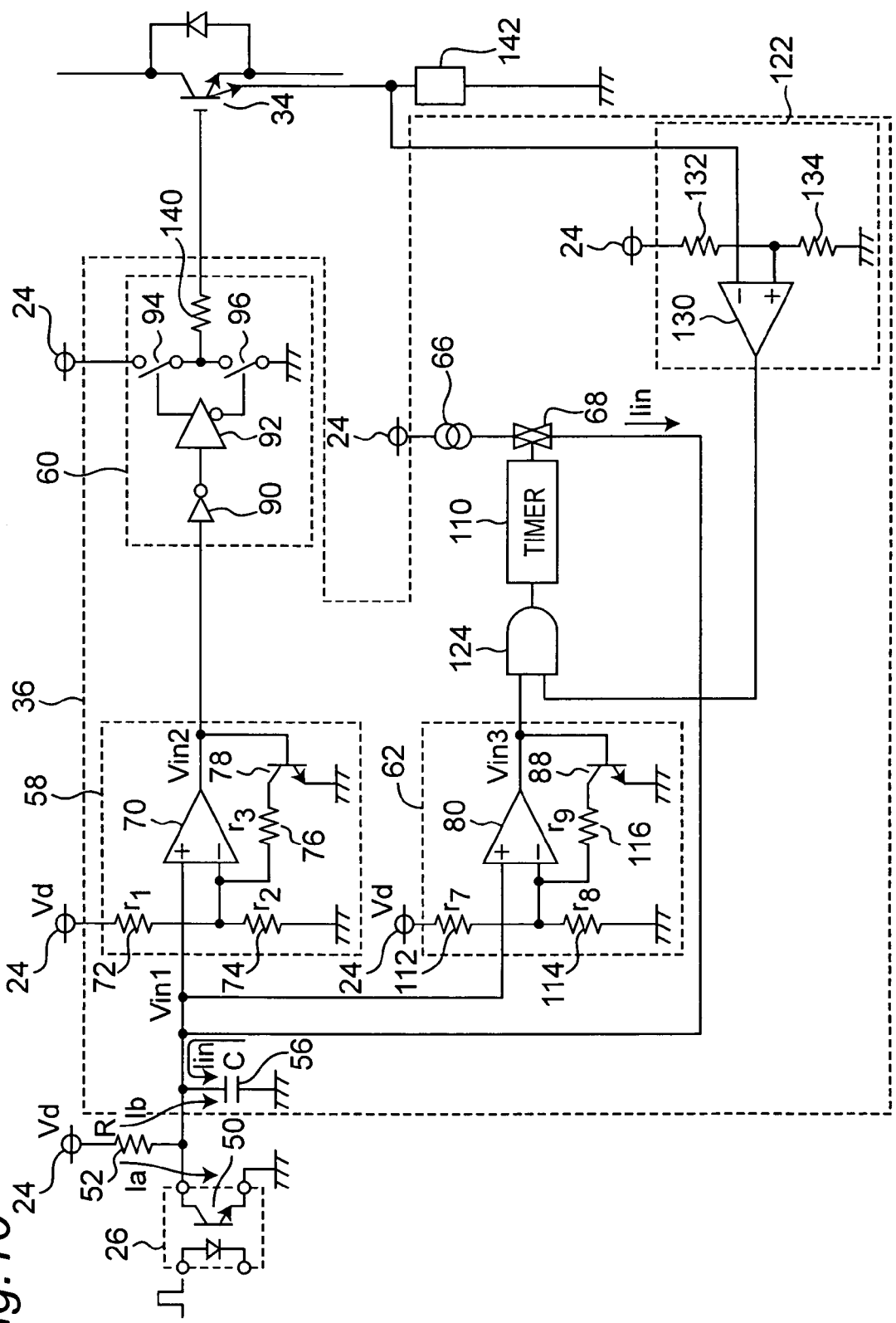
FIG. 10 is a circuit diagram of the driver of the semiconductor device according to the forth embodiment.

FIG. 10 is a circuit diagram of a power device, its driver, and its detector in a semiconductor device according to a fourth embodiment of the present invention. The semiconductor device according to the fourth embodiment includes a detector 104 in addition to the driver 6 and the output circuit 8 (refer to FIG. 7). The detector 104 includes a plurality of detectors 142, each of which corresponds to each power device in the output circuit 8. In the semiconductor device according to this embodiment, the detector 142 is a current sensor that detects the output current of the power device 34 (corresponding to the collector current when the power device 34 is an IGBT), as shown in FIG. 10. The detector 142 may be built in the power device 34. The driver according to this embodiment differs from that in the semiconductor device according to the third embodiment in that the third comparison section 122 performs the comparison by using the output current of the power device 34 in place of the gate voltage of the power device 34.

The current sensor 142 detects the output current of the power device 34 to output a voltage signal in correspondence to the output current. The output signal of the current sensor 142 is input to the comparator 130 in the third comparison section 122. The comparator 130 compares the voltage output from the current sensor 142 with a reference voltage to output a voltage signal based on the comparison results. Specifically, the comparator 130 outputs a high-level voltage, when the voltage output from the current sensor 142 is lower than the reference voltage. This reference voltage is equal to the voltage output from the current sensor 142 when it detects a minute output current perceived as evidence that the power device 34 has started to turn off. The operations of the AND circuit 124, the switch 68, and the other components is the same as described in the third embodiment.

In the semiconductor device according to this embodiment, the timer 110 starts to output a high-level signal to the driver, when the voltage Vin at the voltage-input signal line exceeds a reference voltage and the output current of the power device 34 is detected to be less than a predetermined current. Therefore, a current starts to flow in capacitor 56 in precisely timing with the actual switching of the power device.

Further, according to the driver in the semiconductor device of this embodiment, the charging time for the capacitor is limited to a predetermined period, so that excessive load current flowing in the photo-coupler can be restrained. Therefore, the lifetime of the photo-coupler can be extended, so that the lifetime of power electronics apparatus using this semiconductor device can be extended.

In the driver in the semiconductor device according to this embodiment, the current Iin flows in the voltage-input signal line, and the impedance of the voltage-input signal line declines immediately when the voltage Vin1 at the voltage-input signal line exceeds the OFF-threshold value and the power device starts to turn off. By this process, the rise speed of the voltage Vin1 becomes greater after the voltage Vin1 exceeds the $Eref3_L$ and the power device starts to turn off than before that. If $Eref3_L$ is set near the OFF-threshold value, the voltage Vin1 rises immediately and sufficiently i.e. to a degree not to be influenced by dV/dt of the power device, after the voltage Vin1 exceeds $Eref3_L$ and the power device starts to turn off. In this case, even if a large amount of dV/dt due to the turn-on and turn-off of the power device occurs, the voltage at the voltage-input signal line does not fluctuate near the threshold value, so that the malfunction of the driver can be prevented. Further, as a result, the malfunction of the power device can be prevented.

Fifth Embodiment

Figure 11:
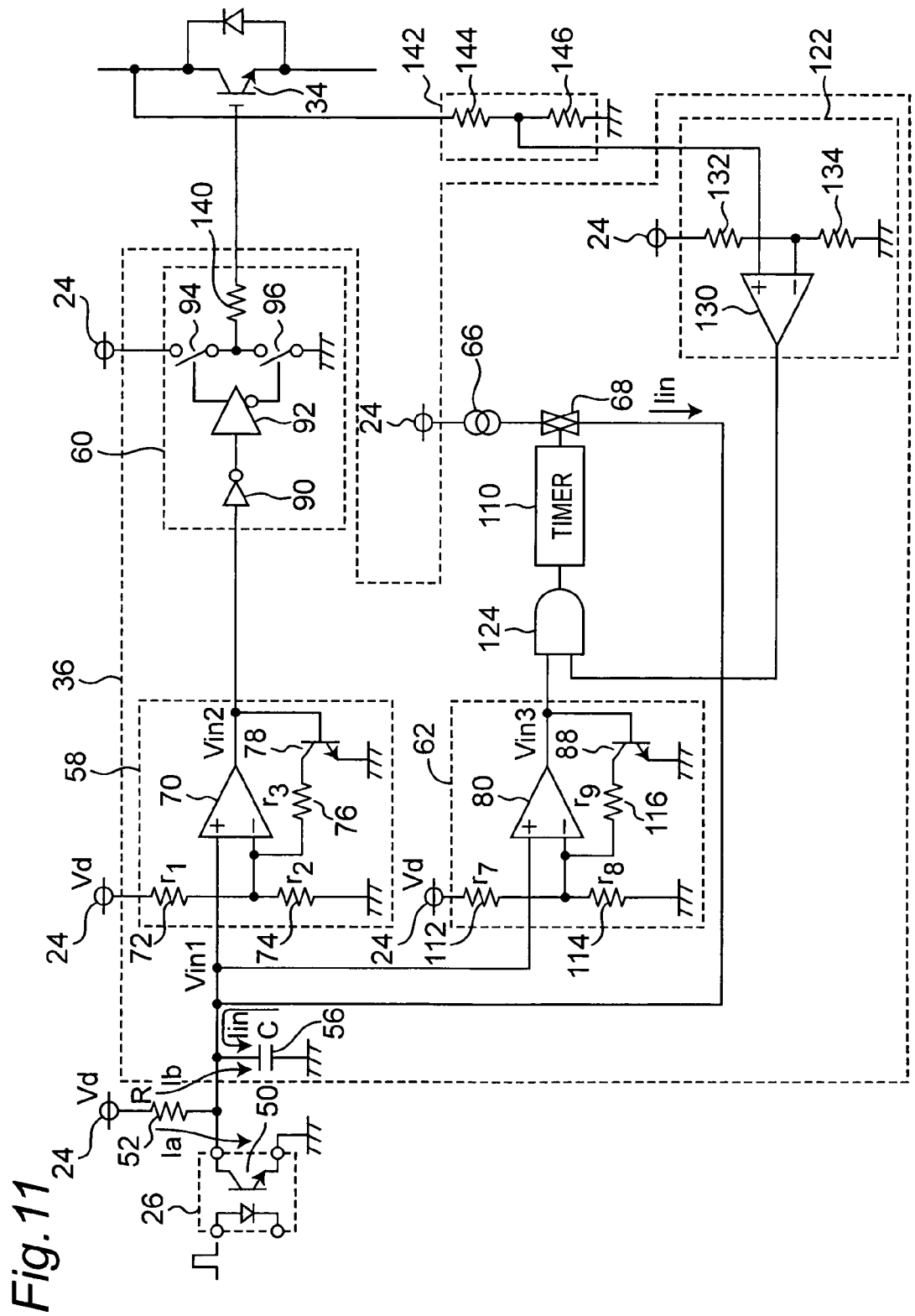
FIG. 11 is a circuit diagram of the driver of the semiconductor device according to the fifth embodiment.

FIG. 11 is a circuit diagram of a power device, its driver, and its detector in the semiconductor device according to a fifth embodiment of the present invention. As shown in FIG. 11, the detector 142 is a voltage divider consisted of resistors 144 and 146, which divides the output voltage of the power device 34 (the collector voltage, if power device 34 is an IGBT). The driver in the semiconductor device according to this embodiment differs from the driver in the semiconductor device according to the fourth embodiment in that a third comparison section 122 performs comparison by using the output voltage of the power device 34 in place of the output current of the power device 34.

As shown in FIG. 11, the third comparison section 122 compares the collector voltage divided by the voltage-divider resistors 144 and 146 with a reference voltage to output a voltage signal based on the comparison results. Specifically, the comparator 130 outputs a high-level voltage, when the output voltage of the power device 34 is higher than the reference voltage. This reference voltage is equal to the output voltage perceived as evidence that the power device 34 has started to turn off.

In the semiconductor device according to this embodiment, the timer 110 starts to output a high-level signal to the driver, when the voltage Vin at the voltage-input signal line exceeds the reference voltage and the output voltage of power device 34 is detected to be actually higher than a predetermined voltage. Therefore, current starts to flow in capacitor 56 in precisely timing with the actual switching of the power device.

Further, according to the driver in the semiconductor device of this embodiment, the charging time for the capacitor is limited to a predetermined period, so that excessive load current flowing in the photo-coupler can be restrained. Therefore, the lifetime of the photo-coupler can be extended, so that the lifetime of power electronics apparatus using this semiconductor device can be extended.

In the driver in the semiconductor device according to this embodiment, the current Iin flows in the voltage-input signal line, and the impedance of the voltage-input signal line declines immediately after the voltage Vin1 at the voltage-input signal line exceeds $Eref3_L$, and the power device starts to turn off. By this process, the rise speed of the voltage Vin1 becomes greater after the voltage Vin1 exceeds $Eref3_L$ and the power device starts to turn off than before that. If $Eref3_L$ is set near the OFF-threshold value, the voltage Vin1 rises immediately and sufficiently i.e. to a degree not to be influenced by dV/dt of the power device, after the voltage Vin1 exceeds $Eref3_L$ and the power device starts to turn off. In this case, even if a large amount of dV/dt due to the turn-on and turn-off of the power device occurs, the voltage at the voltage-input signal line does not fluctuate near the threshold value, so that the malfunction of the driver can be prevented. Further, as a result, the malfunction of the power device can be prevented.

In the semiconductor devices according to the first through fifth embodiments, a metal oxide semiconductor field effect transistor (MOSFET) can be used for the power device. In that case, by selecting the characteristics of the comparators (the comparator outputs a high-level signal: the signal input to the comparator is lower or higher than the reference voltage), either a p-type MSFET or an n-type MOSFET can be used.

Further, by adding a circuit (for example, resistors) that converts the output voltage of the driver control section into a current, a bipolar transistor can be used for the power device. In that case, if conversion circuits that convert the input and output currents into voltage are included, the same effects described in the third and fourth embodiments can be obtained.

It will be obvious to those having skill in the art that many changes may be made in the above-described details of the preferred embodiments of the present invention. The scope of the present invention, therefore, should be determined by the following claims.

What is claimed is:

1. A semiconductor device comprising:
   a power device; and
   a driver which drives said power device;
   wherein said driver comprises,
   a capacitor which is charged or discharged in correspondence to an external control signal,
   a first comparator which compares a voltage of said capacitor with a first reference voltage, and outputs a first signal based on a result of the comparison,
   a drive controller which outputs a drive signal in correspondence to said first signal to said power device, and
   a capacitor charger which detects the voltage of said capacitor based on a comparison of said first signal and a second signal, and supplies a current to said capacitor to charge said capacitor when the voltage of said capacitor is increasing within a given range.

2. The semiconductor device according to claim 1 wherein said capacitor charger comprising:
   a second comparator which compares the voltage of said capacitor with a second reference voltage, and outputs said second signal based on a result of the comparison;
   a detector which detects the voltage of said capacitor by receiving said first and second signals, and outputs a third signal when it detects that the voltage of said capacitor is increasing, is higher than said first reference voltage, and is not higher than said second reference voltage; and
   a current supplier which supplies a current to said capacitor when the current supplier receives said third signal from said detector.

3. The semiconductor device according to the claim 2, wherein said current supplier comprises:
   a source of current; and
   a switch connected to said source of current;
   said switch switches on to allow a current to flow from said source of current when it receives said third signal.

4. A semiconductor device comprising:
   a power device; and
   a driver which drives said power device;
   wherein said driver comprises:
   a capacitor which is charged or discharged in correspondence to an external control signal;
   a first comparator which compares a voltage of said capacitor with a first reference voltage, and outputs a first signal based on a result of the comparison;
   a drive controller which outputs a drive signal in correspondence to said first signal to said power device;
   a second comparator which compares the voltage of said capacitor with a second reference voltage, and outputs a second signal based on a result of the comparison;
   a timer which detects the voltage of said capacitor by receiving said second signal, and outputs a third signal for a predetermined period from a time when the voltage of said capacitor is higher than said second reference voltage; and
   a current supplier which supplies a current to said capacitor when the current supplier receives said third signal from said timer.

5. A semiconductor device comprising:
   a power device; and
   a driver which drives said power device;
   wherein said driver comprising:
   a capacitor which is charged or discharged in correspondence to an external control signal;
   a first comparator which compares a voltage of said capacitor with a first reference voltage, and outputs a first signal based on a result of the comparison;
   a drive controller which outputs a drive signal in correspondence to said first signal to said power device;
   a second comparator which compares the voltage of said capacitor with a second reference voltage, and outputs a second signal based on a result of the comparison;
   a circuit which detects the voltage of said capacitor by receiving said second signal, and detects a driving state of said power device, and outputs a third signal when the voltage of said capacitor is higher than said second reference voltage, and said power device starts turning off;
   a timer which outputs a fourth signal for a predetermined period from a time when it receives said third signal; and
   a current supplier which supplies a current to said capacitor when the current supplier receives said fourth signal from said timer.

6. The semiconductor device according to claim 5, wherein said circuit comprising:
   a converter which converts said drive signal into a fifth voltage signal, if said drive signal is not a voltage signal;
   a third comparator which compares said drive signal, which is a voltage signal or said fifth voltage signal with a third reference voltage, and outputs a sixth signal based on a result of the comparison; and
   a detector which detects the voltage of said capacitor by receiving said second signal and the driving state of said power device by receiving said sixth signal, and outputs said third signal when the voltage of said capacitor is higher than said second reference voltage, and said power device starts turning off.

7. The semiconductor device according to the claim 5, wherein said circuit comprising:
   a first detector which detects a driving state of said power device, and outputs a fifth voltage signal in correspondence to the driving state;
   a third comparator which compares said fifth signal with a third reference voltage, and outputs a sixth signal based on a result of the comparison; and
   a second detector which detects the voltage of said capacitor by receiving said second signal and the driving state of said power device by receiving said sixth signal, and outputs said third signal when the voltage of said capacitor is higher than said second reference voltage, and said power device starts turning off.

* * * * *